(12) United States Patent
Tutt et al.

(10) Patent No.: US 8,102,114 B2
(45) Date of Patent: Jan. 24, 2012

(54) METHOD OF MANUFACTURING AN INVERTED BOTTOM-EMITTING OLED DEVICE

(75) Inventors: Lee W. Tutt, Webster, NY (US); Therese M. Feller, Rochester, NY (US); Peter J. Cowdery-Corvan, Webster, NY (US)

(73) Assignee: Global OLED Technology, LLC., Wilmington, DE (US)

( * ) Notice: Subject to any disclaimer, the term of this patent is extended or adjusted under 35 U.S.C. 154(b) by 134 days.

(21) Appl. No.: 12/394,077

(22) Filed: Feb. 27, 2009

(65) Prior Publication Data
US 2010/0219747 A1   Sep. 2, 2010

(51) Int. Cl.
*H01L 51/50* (2006.01)
(52) U.S. Cl. ..................................................... 313/504
(58) Field of Classification Search .................. 313/504, 313/512; 445/24
See application file for complete search history.

(56) References Cited

U.S. PATENT DOCUMENTS

| | | | |
|---|---|---|---|
| 3,172,862 A | 3/1965 | Gurnee | |
| 3,173,050 A | 3/1965 | Gurnee | |
| 3,180,730 A | 4/1965 | Klupfel et al. | |
| 3,567,450 A | 3/1971 | Brantly et al. | |
| 3,658,520 A | 4/1972 | Brantly et al. | |
| 3,710,167 A | 1/1973 | Dresner | |
| 3,935,031 A | 1/1976 | Adler | |
| 4,356,429 A | 10/1982 | Tang | |
| 4,539,507 A | 9/1985 | VanSlyke | |
| 4,720,432 A | 1/1988 | VanSlyke et al. | |
| 4,769,292 A | 9/1988 | Tang et al. | |
| 4,885,211 A | 12/1989 | Tang | |
| 4,950,950 A | 8/1990 | Perry | |
| 4,976,988 A * | 12/1990 | Honda | ........................ 427/566 |
| 5,047,687 A | 9/1991 | VanSlyke | |
| 5,059,861 A | 10/1991 | Littman | |
| 5,061,569 A | 10/1991 | VanSlyke et al. | |
| 5,073,446 A | 12/1991 | Scozzafava et al. | |
| 5,141,671 A | 8/1992 | Bryan et al. | |
| 5,150,006 A | 9/1992 | Van Slyke et al. | |
| 5,151,629 A | 9/1992 | VanSlyke | |

(Continued)

FOREIGN PATENT DOCUMENTS

EP   0 732 868   9/1996

(Continued)

OTHER PUBLICATIONS

C. Tang et al., "Electroluminescence of doped organic thin films", J. Applied Physics, vol. 65, pp. 3610-3616, 1989.

(Continued)

*Primary Examiner* — Toan Ton
*Assistant Examiner* — Hana Featherly
(74) *Attorney, Agent, or Firm* — McKenna Long & Aldridge, LLP.

(57) ABSTRACT

A method of making an inverted bottom-emitting OLED device, comprising: providing a substrate; providing one or more first electrodes driven by n-type transistors on the substrate; providing an electron-transporting layer over the substrate and first electrode(s), wherein the electron-transporting layer comprises an n-type inorganic semiconductive material with a resistivity in the range of 1 to $10^5$ ohm-cm and a bandgap greater than 2.5 eV; providing an organic light-emitting layer over the electron-transporting layer; providing a hole-transporting layer over the organic emitting layer; and providing a second electrode over the hole-transporting layer.

9 Claims, 4 Drawing Sheets

U.S. PATENT DOCUMENTS

| | | | |
|---|---|---|---|
| 5,276,380 A | 1/1994 | Tang | |
| 5,760,462 A * | 6/1998 | Barron et al. | 257/629 |
| 5,776,623 A | 7/1998 | Hung et al. | |
| 6,069,442 A | 5/2000 | Hung | |
| 6,288,487 B1 | 9/2001 | Arai | |
| 6,744,196 B1 * | 6/2004 | Jeon | 313/498 |
| 6,787,846 B2 * | 9/2004 | Honda | 257/327 |
| 7,132,790 B2 | 11/2006 | Seo et al. | |
| 7,413,892 B2 | 8/2008 | Hunt | |
| 2004/0219389 A1 | 11/2004 | Lee et al. | |
| 2007/0069202 A1 * | 3/2007 | Choi et al. | 257/40 |
| 2007/0238311 A1 | 10/2007 | Levy | |

FOREIGN PATENT DOCUMENTS

| | | |
|---|---|---|
| EP | 0 891 121 | 1/1999 |
| EP | 1 029 909 | 8/2000 |

OTHER PUBLICATIONS

Dresner, "Double Injection electroluminescence in Anthracene" RCA Review, vol. 30, pp. 322-334, 1969.

Bolink et al, Applied Physics Letter 91, 223501 (2007), "Air Stable Hybrid Organic-Inorganic light emitting diodes using ZnO as the cathode", pp. 223501-1 through 223501-3; vol. 91.

* cited by examiner

FIG. 1: (Prior Art)

METHOD OF MANUFACTURING AN INVERTED BOTTOM-EMITTING OLED DEVICE

FIELD OF THE INVENTION

The present invention relates to forming an OLED device with efficient electron transport.

BACKGROUND OF THE INVENTION

Organic electroluminescent (EL) devices are known to be highly efficient and are capable of producing a wide range of colors. Useful applications such as flat-panel displays have been contemplated. Representative of earlier organic EL devices are Gurnee et al U.S. Pat. No. 3,172,862; Gurnee U.S. Pat. No. 3,173,050; Dresner, "Double Injection Electroluminescence in Anthracene," RCA Review, Vol. 30, pp. 322-334, 1969; and Dresner U.S. Pat. No. 3,710,167. Typical organic emitting materials were formed of a conjugated organic host material and a conjugated organic activating agent having condensed benzene rings. The organic emitting material was present as a single layer medium having a thickness much above 1 micrometer. Thus, this organic EL medium was highly resistive and the EL device required an extremely high voltage (>100 volts) to operate.

More recent discoveries in organic EL device construction have resulted in devices having the organic EL medium consisting of extremely thin layers (<1.0 micrometer in combined thickness) separating the anode and cathode. The thin organic EL medium offers reduced resistance, permitting higher current densities for a given voltage. In a basic two-layer EL device structure, one organic layer is chosen to inject and transport holes and the other organic layer is chosen to inject and transport electrons. The interface between the two layers provides an efficient site for the recombination of the injected hole-electron pair and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006 and 5,151,629.

The simple structure can be modified to a three-layer structure, in which an additional luminescent layer is introduced between the hole- and electron-transporting layers to function primarily as the site for hole-electron recombination and thus electroluminescence. In this respect, the functions of the individual organic layers are distinct and can therefore be optimized independently. Thus, the luminescent or recombination layer can be chosen to have a desirable EL color as well as a high luminance efficiency. Likewise, the electron- and hole-transporting layers can be optimized primarily for the carrier transporting property.

One inherent drawback of the organic EL devices is that electron mobility in organic materials is extremely low, so that a high voltage is required to produce a strong electric field. For instance, the electron mobility in tris(8-quinolinolato)aluminum (Alq) is in the range of $10^{-6}$-$10^{-7}$ $cm^2/V \cdot S$, and thus a field of $1 \times 10^6$ V/cm is necessary for efficient electron transport. The thickness of the organic medium can be reduced to lower the voltage level required for device operation, but the reduction results in low quantum efficiency due to radiative quenching by a conducting surface, high leakage current, or device shorting.

In the simplest form, an organic electroluminescent (EL) device is comprised of organic electroluminescent media disposed between first and second electrodes. The first and second electrodes serve as an anode for hole injection and a cathode for electron injection. The organic electroluminescent media supports recombination of holes and electrons that yield emissions of light. These devices are also commonly referred to as organic light-emitting diodes, or OLEDs. A basic organic EL element is described in U.S. Pat. No. 4,356,429. In order to construct a pixilated OLED display device that is useful as a display such as, for example, a television, computer monitor, cell phone display, or digital camera display, individual organic EL elements can be arranged as pixels in a matrix pattern. These pixels can all be made to emit the same color, thereby producing a monochromatic display, or they can be made to produce multiple colors such as a three-pixel red, green, blue (RGB) display. For purposes of this disclosure, a pixel is considered the smallest individual unit, which can be independently stimulated to produce light. As such, the red pixel, the green pixel, and the blue pixel are considered as three distinct pixels.

OLED devices are typically formed as a layered structure with the anode closest to the substrate and the cathode as the outermost active layer. In this configuration, holes flow away from the substrate while electrons flow toward the substrate. Transistors to drive such a device are typically connected to the anodes, which means that high voltage is necessary, e.g. provided by p-type transistors. This is not the desired current direction if one wishes to drive the display by n-type semiconductors.

Zinc oxide has been shown to be useful as a transparent conductive electrode for OLED devices. Bolink et al. in *Applied Physics Letter*, 91, 223501 (2007), showed it can be used as the cathode material for a polymer single component emissive layer. Conductivity of the zinc oxide is paramount when used as a cathode. Therefore, doping of the zinc oxide must be high enough that the material acts as a metal, giving a uniform conduction both laterally and vertically.

In U.S. Pat. No. 6,069,442, Hung et al. used zinc oxide as an electron-transporting layer (ETL) in a typical OLED structure. The resistivity was in the range of 1 to $10^5$ ohm-cm indicating it was acting more as a semiconductor and an ETL than as a cathode. In Hung's examples, the metal oxide was coated on top of the organic materials before application of the cathode. A problem with this approach is that the organic materials tend to be very fragile and reactive, and can therefore be damaged by the conditions necessary to apply zinc oxide.

SUMMARY OF THE INVENTION

There is a need for a simplified OLED device wherein a stable substrate can be premanufactured and not be reactive with the organics while also being more suitable for integration with n-type semiconductors such as zinc oxide and amorphous silicon transistors.

This object is achieved by a method of making an inverted bottom-emitting OLED device, comprising:

a. providing a substrate;

b. providing one or more first electrodes activated by N-type transistors on the substrate;

c. providing an electron-transporting layer over the substrate and first electrode(s), wherein the electron-transporting layer comprises an N-type inorganic semiconductive material with a resistivity in the range of 1 to $10^5$ ohm-cm and a bandgap greater than 2.5 eV;

d. providing an organic emitting layer over the electron-transporting layer;

e. providing a hole-transporting layer over the organic emitting layer; and f. providing a second electrode over the hole-transporting layer.

ADVANTAGES

It is an advantage of this invention that a device made thereby exhibits reduced air sensitivity during some of the process steps, as well as a better n-type semiconductor compatibility.

Since feature dimensions such as layer thicknesses are frequently in sub-micrometer ranges, the drawings are scaled for ease of visualization rather than dimensional accuracy.

DETAILED DESCRIPTION OF THE INVENTION

Figure 1:
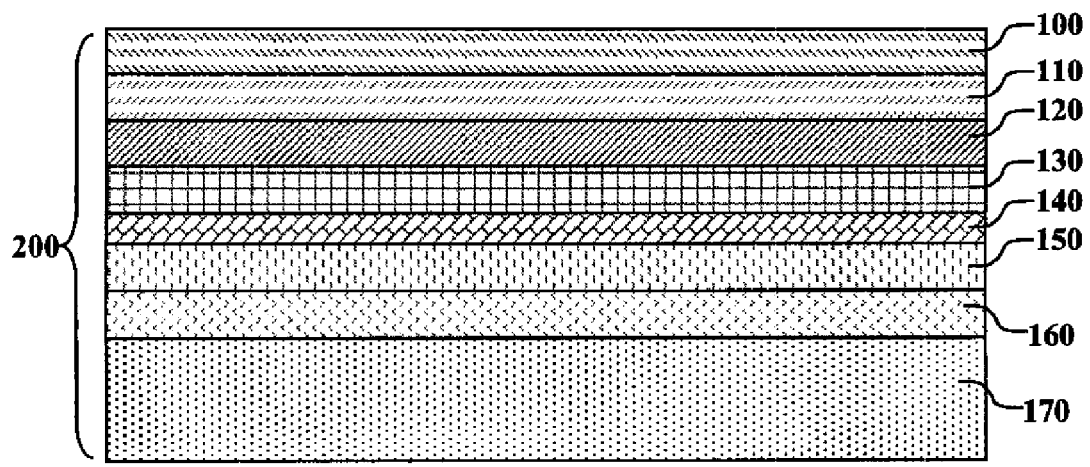
FIG. 1 shows a cross-sectional view of a prior art OLED device.

Turning now to FIG. 1, there is shown a cross-sectional view of a typical prior-art OLED device 200 on a substrate 170. Electron-injecting layer (EIL) 110 injects electrons from cathode 100 to electron-transporting layer (ETL) 120. The ETL transports the electrons into light-emitting layer 130. On the other side, hole-injecting layer (HIL) 150 generates holes by donating an electron into anode 160 and injecting the hole into hole-transporting layer (HTL) 140. The HTL transports the holes to the light-emitting layer. In light-emitting layer 130, the hole and electron combine to yield an exciton which can be captured by a dopant or host and can release the energy as either a photon or as heat. However, it is well-known that OLED device 200 is most efficient with p-type transistors when driving and controlling this device from the substrate side. It is often desirable to use n-type transistors, and thus a device of this structure is not well-suited for such an application.

Figure 2:
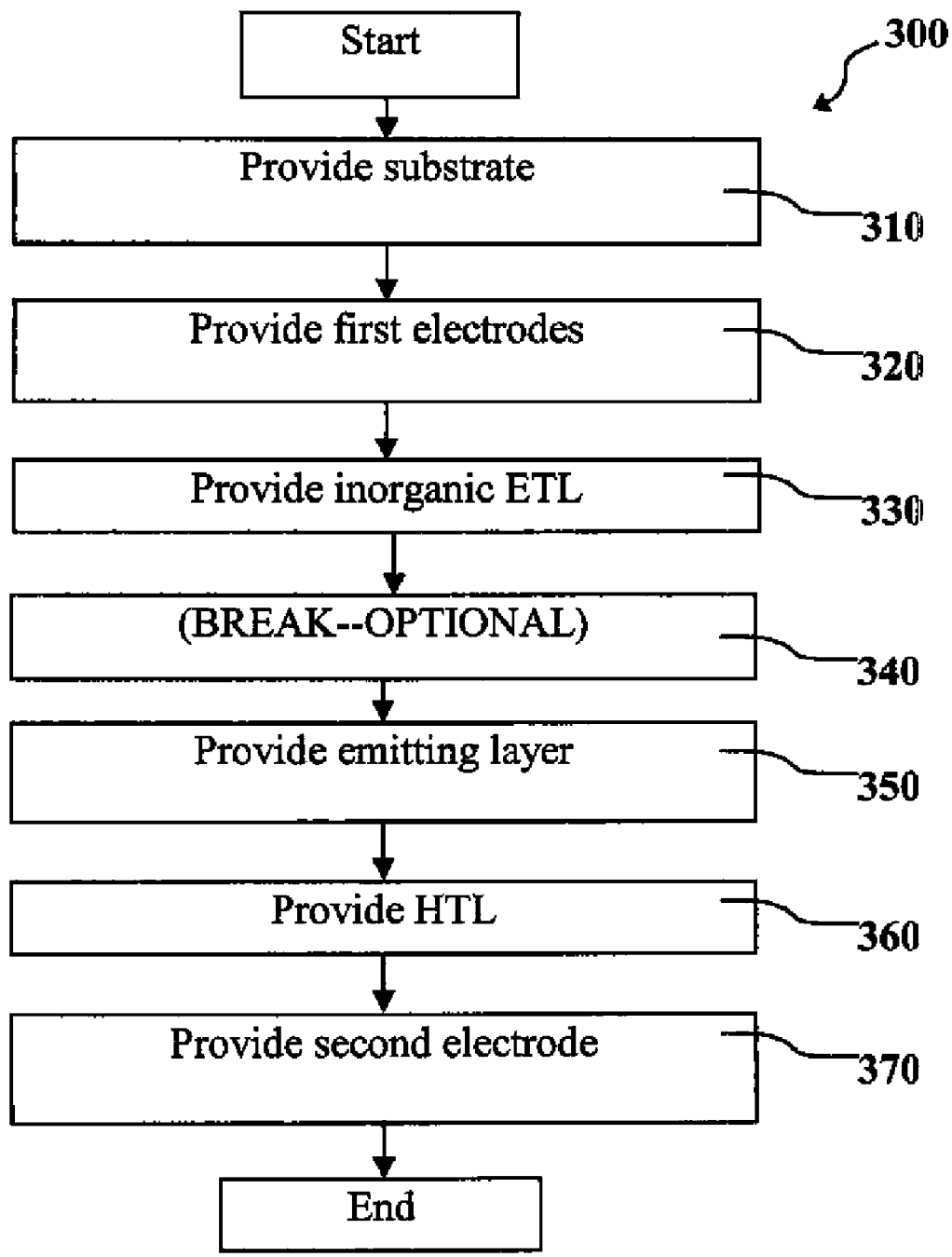
FIG. 2 shows a block diagram of the method of making an inverted bottom-emitting OLED device according to this invention.

Turning now to FIG. 2, there is shown a block diagram of the method of making an inverted bottom-emitting OLED device according to this invention. At the start of method 300, a substrate is provided (Step 310). One or more first electrodes are provided over the substrate (Step 320) and an inorganic electron-transporting layer comprising an n-type inorganic semiconductive material is provided over the substrate and first electrode(s) (Step 330). The first electrodes can be driven by n-type transistors. The n-type inorganic semiconductive material can be deposited by means of atomic-layer deposition, usefully at a temperature greater than 150° C. At this point, it is possible to remove the partially-completed OLED device, if desired or convenient for the manufacturing process, from the manufacturing apparatus and even expose the partially-completed device to air with no negative effects (Step 340). Thus, the n-type semiconductive material deposition can be completed in a first manufacturing process, and subsequent steps (described below) can be performed in a second manufacturing process at a later time or in another location. With most OLED device manufacturing processes, the device must be kept in a vacuum during the entire process as exposing a partially-completed device to air or moisture at any step in the process can render the device useless. Thus, it is an advantage of the present invention that is provides additional options in the manufacturing process.

Next, after reintroducing the partially-completed device to vacuum, the device is provided with an organic light-emitting layer (Step 350), a hole-transporting layer (Step 360) and a second electrode (Step 370). The latter steps are all performed in a vacuum. The device can then be sealed, after which it can again be exposed to the air. Further details of the individual layers will be discussed below.

Figure 3:
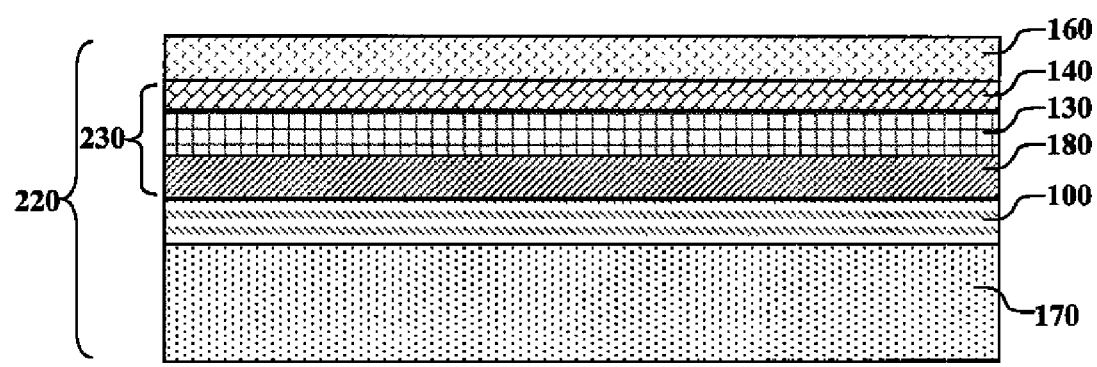
FIG. 3 shows a cross-sectional view of one embodiment of an inverted OLED device prepared according to the method of this invention.

Turning now to FIG. 3, there is shown a cross-sectional view of one embodiment of an inverted OLED device prepared according to the method of this invention. Inverted OLED device 220 comprises substrate 170, a first electrode, e.g. cathode 100, a second electrode, e.g. anode 160, and emissive layers 230 between the electrodes. Emissive layers 230 include inorganic electron-transporting layer 180, light-emitting layer 130, and hole-transporting layer 140. Light-emitting layer 130 serves as the recombination layer where holes and electrons recombine. In the present invention both hole-transporting layer 140 and light-emitting layer 130 are formed of organic materials, while electron-transporting layer 180 is formed of inorganic materials. Electron-transporting layer 180 is formed before light-emitting layer 130. The anode and the cathode are connected to an external AC or DC power source (not shown). The power source can be pulsed, periodic, or continuous.

In operation, inverted OLED device 220 can be viewed as a diode which is forward biased when the anode 160 is at a higher potential than the cathode 100. Under these conditions, holes (positive charge carriers) are injected from the anode into hole-transporting layer 140, and electrons are injected into electron-transporting layer 180. The injected holes and electrons migrate toward the oppositely charged electrode. This results in hole-electron recombination and a release of energy in part as light, thus producing electroluminescence.

Devices often have a common top electrode and only vary the potential on the bottom electrode. This is because the top electrode is difficult to pattern by anything other than a shadow mask without damaging the organic materials. It is well known that the organic materials are sensitive to oxygen and water, and ion bombardment, temperature, and other chemically reactive species can also do damage.

Substrate 170 for inverted OLED device 220 is electrically insulating and light transparent. The light-transparency property is desirable for viewing the EL emission through the substrate. Transparent glass or plastic is commonly employed in such cases. One useful embodiment in this invention is a glass substrate coated with a layer of semiconductor material, e.g. amorphous silicon (a-Si) that can be patterned into an array of n-type transistors for driving an active-matrix display.

A first electrode, e.g. cathode 100, is formed over substrate 170. As light emission is viewed through the cathode 100 and substrate 170, the cathode 100 must be transparent or nearly transparent. For such applications, metals must be thin or one must use transparent conductive oxides such as indium tin oxide or tin oxide, as disclosed by Gurnee et al. in U.S. Pat. No. 3,172,862, Gurnee in U.S. Pat. No. 3,173,050, Dresner in "Double Injection Electroluminescence in Anthracene", RCA Review, Volume 30, pages 322-334, 1969; and Dresner in U.S. Pat. No. 3,710,167, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Inorganic electron-transporting layer 180 is an essential part of this invention. Preferred materials for use in forming the electron-transporting layer are inorganic n-type semiconductive materials. The materials should have a resistivity in the range of 1 to $10^5$ ohm-cm, be transmissive or semi-transmissive to visible light, and be inert with respect to the organic luminescent layer. For transmissivity to visible light, it is desirable that the material have a bandgap greater than 2.5 eV.

An important relationship for choosing an inorganic n-type semiconductive material to form the electron-transporting layer adjacent to an organic luminescent layer (e.g. light-emitting layer 130) is the comparison of the electron affinity of the inorganic material and the energy level of the lowest unoccupied molecular orbital ($E_{LUMO}$) of the organic material. The electron affinity should not be greater than the $E_{LUMO}$ by 1.5 eV in order to achieve efficient electron transport.

The inorganic n-type semiconductive materials can be a metal oxide, metal nitride, zinc sulfide, or zinc selenide. For those materials, the electron mobility is several orders of magnitude greater than that of organic materials, and the resistivity can be readily adjusted by impurity doping or controlling the process temperature or the ambient atmosphere. Suitable metal oxides include zinc oxide and indium oxide. Other materials can be titanium oxide, strontium titanium oxide, barium titanium oxide, gallium nitride, or indium gallium nitride. Combinations of two or more of these materials also can be useful.

The thickness of the inorganic ETL layer is so selected that it would provide a sufficient space separation between the luminescent layer and the bottom cathode. A desirable range of the thickness is from 10 to 2000 nm, usefully 10-500 nm. This inorganic layer can be deposited by many conventional means, such as evaporation, atomic-layer deposition, sputtering, laser ablation, and chemical vapor deposition.

Light-emitting layer 130 of inverted OLED device 220 is an organic light-emitting layer and comprises a luminescent or fluorescent material where electroluminescence is produced as a result of electron-hole pair recombination in this region. In the simplest construction, the luminescent layer comprises of a single component, that is a pure material with a high fluorescent efficiency. A well known material is tris(8-quinolinato) aluminum (Alq), which produces excellent green electroluminescence. A useful embodiment of the light-emitting layer comprises a multi-component material with a host material doped with one or more components of fluorescent dyes. Using this method, highly efficient OLED devices can be constructed. Simultaneously, the color of the OLED devices can be tuned by using fluorescent dyes of different emission wavelengths in a common host material. This dopant scheme has been described in considerable details for OLED devices using Alq as the host material by Tang et al. [J. Applied Physics, Vol. 65, Pages 3610-3616, 1989; U.S. Pat. No 4,769,292].

Hole-transporting layer 140 of inverted OLED device 220 contains at least one hole-transporting aromatic tertiary amine, where the latter is understood to be a compound that has at least one trivalent nitrogen atom bonded only to carbon atoms, at least one of which is a member of an aromatic ring. In one form, the aromatic tertiary amine can be an arylamine, such as a monarylamine, diarylamine, triarylamine, or a polymeric arylamine. Exemplary monomeric triarylamines are illustrated by Klupfel et al. in U.S. Pat. No. 3,180,730. Other suitable triarylamines substituted with vinyl or vinyl radicals and/or containing at least one active hydrogen containing group are disclosed by Brantley et al. in U.S. Pat. Nos. 3,567, 450 and 3,658,520.

A second electrode, e.g. anode 160, is formed over hole-transporting layer 140. As EL emission is viewed through the bottom electrode, the transmissive characteristics of the anode material are immaterial and any conductive material can be used, transparent, opaque or reflective. Example conductors for this application include, but are not limited to, gold, iridium, molybdenum, palladium, and platinum. The anode can have multiple layers to allow better conductivity. For example, silver can be applied for good reflectivity but be backed with aluminum to provide further conduction and prevent tarnishing. The preferred anode materials, transmissive or otherwise, have a work function of 4.1 eV or greater. Desired anode materials can be deposited by any suitable means such as evaporation, sputtering, chemical vapor deposition, or electrochemical means.

Figure 4:
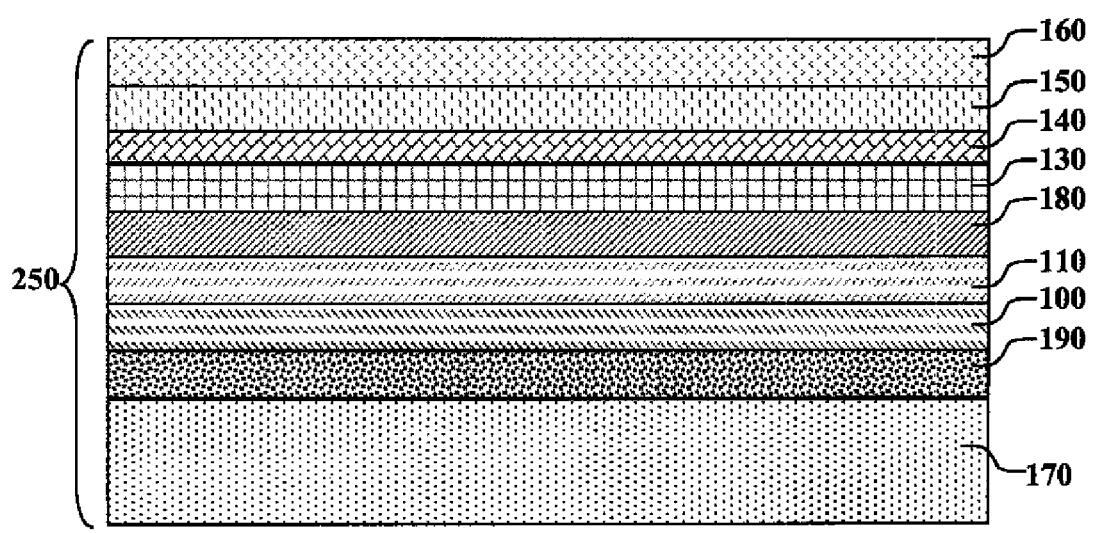
FIG. 4 shows a cross-sectional view of another embodiment of an inverted OLED device prepared according to the method of this invention.

Turning now to FIG. 4, there is shown a cross-sectional view of another embodiment of an inverted OLED device prepared according to the method of this invention. Inverted OLED device 250 includes the features of inverted OLED device 220 described above, as well as some additional optional layers. Inverted OLED device 250 can include active matrix control circuitry. Active matrix layer 190 contains all the layers necessary to form an active matrix, including metals, semiconductors, insulators, and leveling materials. In such a structure, active matrix layer 190 presents a plurality of individually controlled areas, or pixels, in inverted OLED device 250. In this structure, cathode 100 will in actuality be a plurality of cathodes, while anode 160 will be common to the entire device. The transistors formed in active matrix layer 190, which drive the device through cathodes 100, are n-type transistors. They can be made from an n-type inorganic semiconductive material, e.g. amorphous silicon or zinc oxide, and can be of the same material used in electron-transporting layer 180, or a different material. If the transistors are made from a wide bandgap material such as zinc oxide, and the metal electrodes are formed from a transparent metal such as ITO, then the transistors can be directly under the OLED device for through-substrate viewing. Otherwise the active matrix will need to be beside the OLED devices to provide some aperture through the substrate.

Since cathode 100 is the electrode closest to the substrate, this is the easiest electrode to connect to the drive transistors of active matrix layer 190. In this configuration, anode 160 can be common to an entire display. By pulling the cathode to ground and providing a positive voltage on the anode, one can easily drive the OLED. This requires n-type transistors for adequate performance. Both zinc oxide and amorphous silicon are n-type semiconductors and therefore will work well as n-type transistors.

Electron injecting layer 110, if present, should be an inorganic material such that the electrons are efficiently injected into the electron-transporting material, which is an inorganic oxide. Examples of this are alkali or alkaline fluorides, which include lithium fluoride, sodium fluoride, potassium fluoride, rubidium fluoride, cesium fluoride, magnesium fluoride, calcium fluoride, strontium fluoride and barium fluoride.

Hole-injecting layer 150 can also be present to aid in the injection of holes from the anode to the hole-transporting layer. Examples of hole-injecting materials are molybdenum oxide and hexacyanohexaazatriphenylene. Other HIL materials are porphyrinic compounds. A porphyrinic compound is any compound, natural or synthetic, which is derived from or includes a porphyrin structure, including porphine itself. Any of the porphyrinic compounds disclosed by Adler in U.S. Pat. No. 3,935,031 or Tang in U.S. Pat. No. 4,356,429, the disclosures of which are here incorporated by reference, can be employed. Other HIL materials are presented in EP 0 891 121 A1 and EP 1 029 909 A1 and incorporated by reference.

EXAMPLES

The glass substrates, precoated with indium tin oxide 40-80 nm in an electrode pattern, were obtained from Polytronix Co. (Richardson, Tex.). In all cases, the ZnO was deposited by a spatial atomic-layer deposition head as described in U.S. Pat. No. 7,413,892 and U.S. Patent Application 2007/0238311 A1 using diethyl zinc and ammoniated water as the two gasses, separated by a nitrogen purge. The substrate was heated to 200° C. and the head oscillated over the surface at a rate of approximately 1 cycle per second, which yielded a growth rate of 0.3 nm per cycle. A sheet resistivity of >1 Meg ohms/square and thickness of 40 nm (resistivity of >4 ohm-cm) was obtained after 133 cycles.

Example 1

Comparative

An OLED device was constructed in the following manner:
1. A clean glass substrate with an ITO pattern was placed in a vacuum chamber and evacuated to $5 \times 10^{-6}$ torr.
2. The above-prepared substrate was treated by vacuum depositing a 60 nm including 94% 2-phenyl-9,10-bis(2-naphthyl)anthracene (PBNA) as host with 2% 4-(dicyanomethylene)-2-t-butyl-6-(1,1,7,7-tetramethyljulohdyl-9-enyl)-4H-pyran (DCJTB, a red dopant) as a light-emitting layer.
3. The above-prepared substrate was further treated by vacuum-depositing a 120 nm layer of 4,4'-bis[N-(1-naphthyl)-N-phenylamino]biphenyl (NPB) as a hole-transporting layer.
4. The above-prepared substrate was further treated by vacuum-depositing a 10 nm layer of hexacyanohexaazatriphenylene (CHATP) as a hole-injecting layer (HIL).

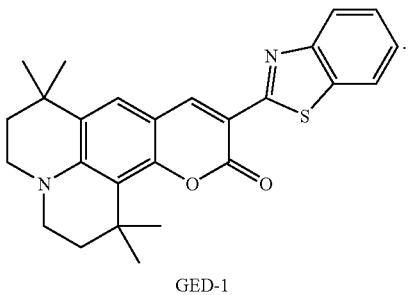

CHATP

5. A 60 nm silver anode layer was deposited onto the sample by vacuum evaporation.

Example 2

Inventive

An OLED device was constructed as described in Example 1, except that the following step was added between Steps 1 and 2:

1a. A 40 nm layer of unpatterned ZnO was deposited uniformly on the substrate.

After deposition, a positive voltage was applied to the top (anode) electrode and a negative voltage to the bottom (cathode) electrode at a constant current of 20 ma/cm². Any spectral output was measured. Example 1, the comparative example did not emit. Inventive Example 2 emitted orange light with a spectral maximum at 593 nm wavelength and a luminance of 61 candela/m². This shows that the zinc oxide layer, which is an electron-transporting layer, enables this device to function.

Example 3

Comparative

An OLED device was constructed in the following manner:
1. A clean glass substrate with an ITO pattern was placed in a vacuum chamber and evacuated to $5 \times 10^{-6}$ torr.
2. The above-prepared substrate was treated by vacuum depositing a 40 nm PBNA layer with 0.75% green-emitting dopant GED-1 as a light-emitting layer.

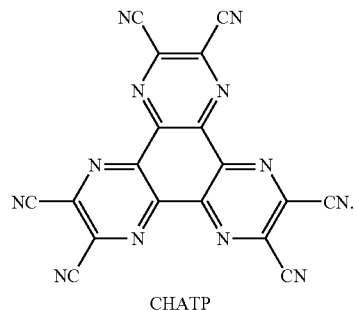

GED-1

3. The above-prepared substrate was further treated by vacuum-depositing a 75 nm layer of NPB as a hole-transporting layer.
4. A 10 nm hole-injecting layer of CHATP was vacuum-deposited onto the substrate at a coating station.
5. A 40 nm silver anode layer was deposited onto the sample by vacuum evaporation.
6. A 30 nm aluminum conductive protective layer was deposited onto the sample by vacuum evaporation.

Example 4

Inventive

An OLED device was constructed as described in Example 3, except that the following step was added between Steps 1 and 2:

1a. A 40 nm layer of unpatterned ZnO was deposited uniformly on the substrate. The sample was briefly dipped in deionized water and then dried before placing in a vacuum chamber.

After deposition, a positive voltage was applied to the top (anode) electrode and a negative voltage to the bottom (cathode) electrode at a constant current of 20 ma/cm². Any spectral output was measured. Example 3, the comparative example, did not emit. Inventive Example 4 emitted green light with a spectral maximum at 535 nm wavelength and a luminance of 2800 candela/m². Example 4 shows the robustness of the completed device to humidity exposure of the intermediate inorganic coated portion of the OLED. This allows one to pre-manufacture a substrate with active matrix electronics and an electron-transporting layer, and store it without extraordinary precautions against air or moisture, for later addition of the organic moisture- and temperature-sensitive organic materials. This is a distinct advantage over prior-art inverted OLED devices, which utilized a moisture-sensitive organic electron-transporting layer. Such prior art devices required that the electron-transporting layer be manufactured together with the remainder of the OLED device.

Example 5

Comparative

An OLED device was constructed in the following manner:
1. A clean glass substrate with an ITO pattern was placed in a vacuum chamber and evacuated to $5 \times 10^{-6}$ torr.
2. The above-prepared substrate was treated by vacuum depositing a 40 nm PNBA layer with 1% tetra-t-butylperylene (TBP) as a blue light-emitting layer.
3. The above-prepared substrate was treated by vacuum depositing a 20 nm NPB layer with 1% yellow-orange emitting dopant diphenyltetra-t-butylrubrene (PTBR) as a yellow light-emitting layer.

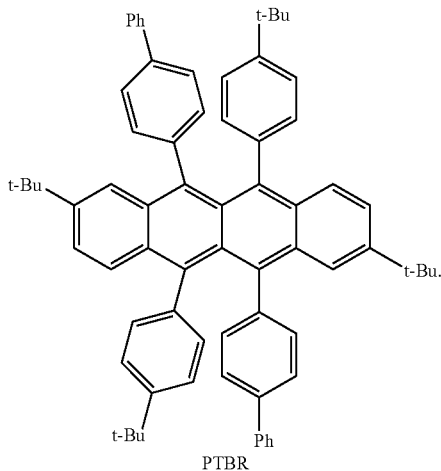

PTBR

4. The above-prepared substrate was further treated by vacuum-depositing a 40 nm layer of NPB as a hole-transporting layer.
5. A 10 nm hole-injecting layer of CHATP was vacuum-deposited onto the substrate at a coating station,
6. A 100 nm silver anode layer was deposited onto the sample by vacuum evaporation.

Example 6

Inventive

An OLED device was constructed as described in Example 5, except that the following step was added between Steps 1 and 2:
1a. A 40 nm layer of unpatterned ZnO was deposited uniformly on the substrate.
After deposition, a positive voltage was applied to the top (anode) electrode and a negative voltage to the bottom (cathode) electrode at a constant current of 20 ma/cm². Any spectral output was measured. Example 5, the comparative example, did not emit. Inventive Example 6 shows the use of a double emission layer, which provides multiple emission peaks, with the inorganic electron-transporting layer. Example 6 emitted a color of about 0.46 CIEx, 0.46 CIEy, which is an approximation of white, at 20 ma/cm² and a luminance of 137 candela/m².

The invention has been described in detail with particular reference to certain preferred embodiments thereof, but it will be understood that variations and modifications can be effected within the spirit and scope of the invention. For example, the electron transporting layer can be a single inorganic layer or an inorganic layer with another underlying organic layer.

PARTS LIST 100 cathode
110 electron-injecting layer
120 electron-transporting layer
130 light-emitting layer
140 hole-transporting layer
150 hole-injecting layer
160 anode
170 substrate
180 inorganic electron-transporting layer
190 active matrix layer
200 OLED device
220 inverted OLED device
230 emissive layers
250 inverted OLED device
300 method
310 step
320 step
330 step
340 step
350 step
360 step
370 step

The invention claimed is:
1. A method of making an inverted bottom-emitting OLED device, comprising:
   a. providing a substrate;
   b. providing one or more first electrodes driven by transistors of an n-type on the substrate;
   c. providing an electron-transporting layer over the substrate and first electrode(s), wherein the electron-transporting layer comprises an n-type inorganic semiconductive material with a resistivity in the range of 1 to $10^5$ ohm-cm and a bandgap greater than 2.5 eV;
   d. providing an organic light-emitting layer over the electron-transporting layer;
   e. providing a hole-transporting layer over the organic emitting layer; and
   f. providing a second electrode over the hole-transporting layer,
   wherein said steps a to f take place in a sequential order.
2. The method of claim 1 wherein the transistors also comprise the n-type inorganic semiconductive material.
3. The method of claim 1 wherein the one or more first electrodes are cathodes and the second electrode is an anode.
4. The method of claim 3 wherein the anode is common to the entire device.
5. The method of claim 1 wherein the n-type inorganic semiconductive material includes zinc oxide, zinc sulfide, or zinc selenide, or combinations thereof.

6. The method of claim 5 wherein the electron-transporting layer has a thickness in the range of 10 nm to 500 nm.

7. The method of claim 1 wherein the n-type inorganic semiconductive material is deposited by means of atomic layer deposition.

8. The method of claim 7 wherein the deposition is effected at a temperature greater than 150° C.

9. The method of claim 1 wherein the n-type inorganic semiconductive material deposition is completed in a first manufacturing process and subsequent steps are performed in a second later manufacturing process.

* * * * *